(12) United States Patent
Xiao et al.

(10) Patent No.: US 12,242,161 B2
(45) Date of Patent: Mar. 4, 2025

(54) ARRAY SUBSTRATE AND DISPLAY PANEL

(71) Applicants: CHENGDU BOE DISPLAY SCI-TECH CO., LTD., Sichuan (CN); BOE Technology Group Co., Ltd., Beijing (CN)

(72) Inventors: Feng Xiao, Beijing (CN); Liangjun Liu, Beijing (CN); Wei Zhu, Beijing (CN)

(73) Assignees: CHENGDU BOE DISPLAY SCI-TECH CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/022,433

(22) PCT Filed: Apr. 27, 2022

(86) PCT No.: PCT/CN2022/089589
§ 371 (c)(1),
(2) Date: Feb. 21, 2023

(87) PCT Pub. No.: WO2023/206148
PCT Pub. Date: Nov. 2, 2023

(65) Prior Publication Data
US 2024/0264502 A1 Aug. 8, 2024

(51) Int. Cl.
*G02F 1/1368* (2006.01)
*G02F 1/1362* (2006.01)
*H01L 27/12* (2006.01)

(52) U.S. Cl.
CPC ...... *G02F 1/1368* (2013.01); *G02F 1/136286* (2013.01); *H01L 27/1244* (2013.01); *G02F 1/136213* (2013.01); *H01L 27/1255* (2013.01)

(58) Field of Classification Search
CPC ............. G02F 1/1368; G02F 2201/122; H01L 27/1214
See application file for complete search history.

(56) References Cited

U.S. PATENT DOCUMENTS

| | | | |
|---|---|---|---|
| 2006/0170067 A1* | 8/2006 | Maekawa | H01L 29/78678 257/E21.414 |
| 2012/0261661 A1 | 10/2012 | Maekawa et al. | |
| 2022/0229338 A1 | 7/2022 | Zhu et al. | |

FOREIGN PATENT DOCUMENTS

| | | |
|---|---|---|
| CN | 1794075 A | 6/2006 |
| CN | 101442059 A | 5/2009 |

(Continued)

*Primary Examiner* — Dung T Nguyen
(74) *Attorney, Agent, or Firm* — WHDA, LLP

(57) ABSTRACT

The present application provides an array substrate and a display panel. The array substrate includes a gate of a thin film transistor; a first electrode of the transistor, including a first body and a first end; a second electrode of the transistor, including a second body and a second end; orthographic projections of the first body and the second body being located in an orthographic projection of the gate, orthographic projections of at least partial area of the first end and at least partial area of the second end not overlapping with the orthographic projection of the gate, an orthographic projections of the first end and the second end being both located on the same side of the orthographic projection of the gate; in a first direction, an average distance from the first end to the second end is greater than that from the first body to the second body.

16 Claims, 8 Drawing Sheets

(56) References Cited

FOREIGN PATENT DOCUMENTS

| | | |
|---|---|---|
| CN | 108983512 A | 12/2018 |
| CN | 112859463 A | 5/2021 |
| JP | 2002141509 A | 5/2002 |
| KR | 20020096228 A | 12/2002 |

* cited by examiner

ARRAY SUBSTRATE AND DISPLAY PANEL

TECHNICAL FIELD

The present application relates to the field of display technology, in particular to an array substrate and a display panel.

BACKGROUND

With the rapid development of display technologies, requirements on the performance and quality of an array substrate in a display product are getting higher and higher in the industry. However, in the related art, in the case of unstable preparation process or limited preparation accuracy, parasitic capacitors with different capacitance values or other adverse problems are easily generated between film layers, which results in a decrease in the preparation yield and quality of the array substrate.

SUMMARY

Embodiments of the present application adopt the following technical solutions.

In a first aspect, embodiments of the present application provide an array substrate, including:
  a gate of a thin film transistor, extending in a first direction;
  a first electrode of the thin film transistor, including a first body and a first end that are connected to each other; and
  a second electrode of the thin film transistor, including a second body and a second end that are connected to each other;
  where an orthographic projection of the first body on a base of the array substrate and an orthographic projection of the second body on the base are located in an orthographic projection of the gate on the base, an orthographic projection of at least partial area of the first end on the base and an orthographic projection of at least partial area of the second end on the base do not overlap with the orthographic projection of the gate on the base, and an orthographic projection of the first end on the base and an orthographic projection of the second end on the base are both located on a same side of the orthographic projection of the gate on the base;
  in the first direction, an average distance from the first end to the second end is greater than an average distance from the first body to the second body.

In some embodiments of the present application, the first electrode further includes a third end, and the first end and the third end are connected via the first body; the second electrode further includes a fourth end, and the second end and the fourth end are connected via the second body;
  an orthographic projection of at least partial area of the third end on the base and an orthographic projection of at least partial area of the fourth end on the base do not overlap with the orthographic projection of the gate on the base; and
  in the first direction, an average distance from the third end to the fourth end is greater than the average distance from the first body to the second body.

In some embodiments of the present application, the array substrate further includes a gate line, a data line, a pixel electrode, a first trace and a second trace, the data line intersects with the gate line and is insulated from the gate line, the gate is electrically connected to the gate line, the pixel electrode is located at a position defined by two adjacent data lines and two adjacent gate lines, the third end of the first electrode is electrically connected to the data line via the first trace, and the second end of the second electrode is electrically connected to the pixel electrode via the second trace;
  in a direction pointing from a junction between the first body and the third end to a junction between the first trace and the third end, a minimum distance from the third end to the data line is gradually reduced; and
  in a direction pointing from a junction between the second body and the second end to a junction between the second trace and the second end, a minimum distance from the second end to the data line is gradually increased.

In some embodiments of the present application, in a direction pointing from a junction between the first body and the first end to a part of the first end facing away from the first body, a minimum distance from the first end to the second end is gradually increased, and a minimum distance from the first end to the data line is gradually reduced; and
  in a direction pointing from a junction between the second body and the fourth end to a part of the fourth end facing away from the second body, a minimum distance from the fourth end to the third end is gradually increased, and a minimum distance from the fourth end to the data line is gradually increased.

In some embodiments of the present application, each of the orthographic projections of the first end, the second end, the third end and the fourth end on the base does not overlap with the orthographic projection of the gate on the base.

In some embodiments of the present application, each of the orthographic projections of the first end, the second end, the third end and the fourth end on the base partially overlaps with the orthographic projection of the gate on the base.

In some embodiments of the present application, the first end includes a first adjustment subpart and a first protection subpart, and the first adjustment subpart is located between the first body and the first protection subpart;
  in a direction pointing from the first body to the first end, a minimum distance from the first adjustment subpart to the data line is gradually reduced, and a minimum distance from the first protection subpart to the data line is kept unchanged.

In some embodiments of the present application, the fourth end includes a fourth adjustment subpart and a second protection subpart, and the fourth adjustment subpart is located between the second body and the second protection subpart;
  in a direction pointing from the second body to the fourth end, a minimum distance from the fourth adjustment subpart to the data line is gradually increased, and a minimum distance from the second protection subpart to the data line is kept unchanged.

In some embodiments of the present application, the first end includes a first adjustment subpart and a first protection subpart, and the first adjustment subpart is located between the first body and the first protection subpart; the second end includes a second adjustment subpart; the third end comprises a third adjustment subpart; the fourth end comprises a fourth adjustment subpart and a second protection subpart, and the fourth adjustment subpart is located between the second body and the second protection subpart;
  each of orthographic projections of geometric centers of the first adjustment subpart, the second adjustment subpart, the third adjustment subpart and the fourth adjustment subpart on the base is located on a contour of the orthographic projection of the gate on the base.

In some embodiments of the present application, a minimum distance from an orthographic projection of the first protection subpart on the base to the orthographic projection of the gate on the base, a minimum distance from an orthographic projection of the second protection subpart on the base to the orthographic projection of the gate on the base, a minimum distance from an orthographic projection of the first trace on the base to the orthographic projection of the gate on the base and a minimum distance from an orthographic projection of the second trace on the base to the orthographic projection of the gate on the base are all greater than or equal to 2 µm.

In some embodiments of the present application, each of shapes of the orthographic projections of the first end, the second end, the third end and the fourth end on the base includes at least one of an arc, a polygon and a shape constituted by the arc and the polygon.

In some embodiments of the present application, the shapes of the orthographic projections of the first adjustment subpart, the second adjustment subpart, the third adjustment subpart and the fourth adjustment subpart on the base are all parallelograms, and the shapes of the orthographic projections of the first protection subpart and the second protection subpart on the base are both rectangles.

In some embodiments of the present application, a size of the orthographic projection of the first adjustment subpart on the base in the first direction is equal to a size of the orthographic projection of the first protection subpart on the base in the first direction, and a size of the orthographic projection of the fourth adjustment subpart on the base in the first direction is equal to a size of the orthographic projection of the second protection subpart on the base in the first direction.

In some embodiments of the present application, the gate line includes a first line segment and a second line segment, the first line segment intersects with and is insulated from the data line, and a partial area of the second line segment is used as the gate;

a size of an orthographic projection of the second line segment on the base in a direction perpendicular to the first direction is greater than a size of an orthographic projection of the first line segment on the base in the direction perpendicular to the first direction.

In some embodiments of the present application, the gate line includes a first line segment, a second line segment and a third line segment, the first line segment intersects with and is insulated from the data line, the second line segment is used as the gate, and the third line segment is located on an end of the second line segment facing away from the first line segment;

a size of an orthographic projection of the second line segment on the base in a direction perpendicular to the first direction is greater than a size of an orthographic projection of the third line segment on the base in the direction perpendicular to the first direction, and the size of the orthographic projection of the third line segment on the base in the direction perpendicular to the first direction is greater than a size of an orthographic projection of the first line segment on the base in the direction perpendicular to the first direction.

In some embodiments of the present application, the array substrate further includes an active layer located on a side of the gate facing away from the base, an outer contour of an orthographic projection of the active layer on the base is located within an outer contour of the orthographic projection of the gate on the base, and a partial area of the first electrode and a partial area of the second electrode are in direct contact with the active layer;

a size of the orthographic projection of the active layer on the base in a direction perpendicular to the first direction is less than a size of the orthographic projection of the first body on the base in the direction perpendicular to the first direction, and the size of the orthographic projection of the active layer on the base in the direction perpendicular to the first direction is less than a size of the orthographic projection of the second body on the base in the direction perpendicular to the first direction.

In some embodiments of the present application, the array substrate includes a first storage capacitance line, a second storage capacitance line, a third storage capacitance line and a fourth storage capacitance line disposed on a same layer of the gate;

the first storage capacitance line, the second storage capacitance line and the third storage capacitance line are all located between two adjacent data lines and extend in a direction same as an extension direction of the data line; and the fourth storage capacitance line intersects with and is connected to each of the first storage capacitance line, the second storage capacitance line and the third storage capacitance line, and each of orthographic projections of the first storage capacitance line, the second storage capacitance line, the third storage capacitance line and the fourth storage capacitance line on the base overlaps with an orthographic projection of the pixel electrode on the base.

In some embodiments of the present application, the second storage capacitance line is located between the first storage capacitance line and the third storage capacitance line, the array substrate further includes a conducting island disposed on the same layer with the data line, an orthographic projection of an intersection of the second storage capacitance line and the fourth storage capacitance line on the base overlaps with an orthographic projection of the conducting island on the base, and the conducting island is electrically connected to the pixel electrode.

In a second aspect, embodiments of the present application provide a display panel including array substrates described above.

The above-mentioned description is only a summary of the technical solutions of the present application. In order to more clearly know about the technical means of the present application and implement them according to the content of the description, and in order to make the above-mentioned and other objectives, features, and advantages of the present application more clear and comprehensible, the specific implementations of the present application will be listed below.

BRIEF DESCRIPTION OF THE DRAWINGS

To describe the technical solutions in embodiments of the present application or the related art more clearly, the accompanying drawings required for describing the embodiments or the related art will be briefly introduced below. Apparently, the accompanying drawings in the following description show only some embodiments of the present application, and those skilled in the art may still derive other accompanying drawings from these accompanying drawings without creative efforts.

DETAILED DESCRIPTION OF THE EMBODIMENTS

Figure 1:
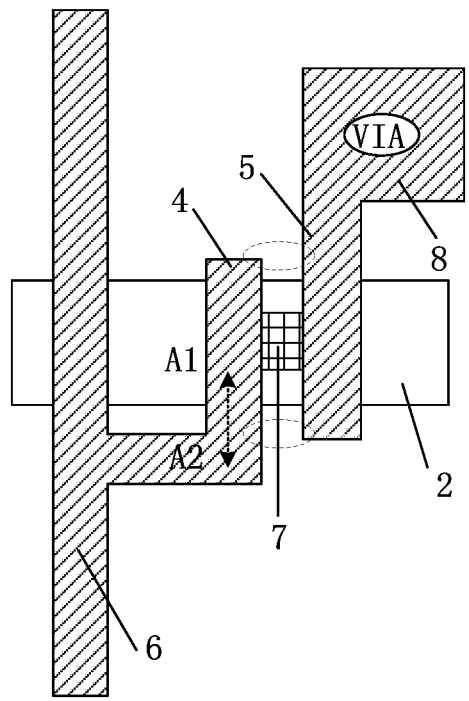
FIG. 1 is a schematic structural diagram illustrating an array substrate in the related art.

The technical solutions in embodiments of the present application will be described clearly and completely below in conjunction with the accompanying drawings in embodiments of the present application. Apparently, the described embodiments are only a part of the embodiments of the present application, but not all of the embodiments. Based on the embodiments of the present application, all other embodiments obtained by those skilled in the art without creative efforts shall fall within the protection scope of the present application.

In the drawings, for clarity, the thicknesses of areas and layers may be exaggerated. The same reference numerals in the drawings represent the same or similar structure, and therefore, their detailed description will be omitted. In addition, the accompanying drawings are only schematic illustrations of the present application, but are not necessarily to be drawn in scale.

In embodiments of the present application, "a plurality of" means two or more unless it is specifically defined otherwise. Directional or positional relationships indicated by terms such as "upper" are based on directional or positional relationships as shown in the accompanying drawings, and are only for the purposes of facilitating describing the present application and simplifying the description, rather than indicating or implying that the referred structure or element has to have a specific direction or be constructed and operated in the specific direction, and therefore, they cannot be regarded as limitations on the present application.

In embodiments of the present application, a source and a drain of a transistor are symmetric, and can be interchangeable. In embodiments of the present application, one of the source and drain of the transistor is referred to as a first electrode, and the other one of the source and drain electrodes is referred to as a second electrode.

In embodiments of the present application, the term "electrically connected" may mean that two components are directly electrically connected or two components are electrically connected via one or more other components.

Unless it is required in the context otherwise, the term "including" in the overall specification and the claims is interpreted as open inclusion, i.e. "including, but not limited to". In the description of the specification, the term "an embodiment", "some embodiments", "exemplary embodiments", "examples", "specific examples" or "some examples" is intended to indicate that specific features, structures, materials or characteristics related to this embodiment or example are included in at least one embodiment or example of the present application. The schematic indication of the above-mentioned terms does not necessarily refer to the same embodiment or example. In addition, the specific features, structures, materials or characteristics can be included in any one or more embodiments or examples in any proper way.

In embodiments of the present application, the words "first", "second", etc. are adopted to distinguish the same or similar items having the basically same functions and effects, and are only intended to clearly describe the technical solutions in embodiments of the present application, rather than to be understood as indicating or implying the relative importance or implicitly indicating the number of indicated technical features.

Embodiments of the present application provide an array substrate. Referring to FIG. 3 to FIG. 8, the array substrate includes:

a gate of a thin film transistor, extending in a first direction OA;

a first electrode 4 of the thin film transistor, including a first body 41 and a first end 42 connected to each other; and a second electrode 5 of the thin film transistor, including a second body 51 and a second end 52 connected to each other;

each of an orthographic projection of the first body 41 on a base of the array substrate and an orthographic projection of the second body 51 on the base of the array substrate is located in an orthographic projection of the gate on the base; each of an orthographic projection of at least partial area of the first end 42 on the base and an orthographic projection of at least partial area of the second end 52 on the base does not overlap with the orthographic projection of the gate on the base; and an orthographic projection of the first end 42 on the base and an orthographic projection of the second end 52 on the base are both located on the same side of the orthographic projection of the gate on the base;

and in the first direction OA, an average distance from the first end 42 to the second end 52 is greater than an average distance from the first body 41 to the second body 51.

In an exemplary embodiment, the average distance from the first end 42 to the second end 52 refers to an average value of the maximum distance from the first end 42 to the second end 52 and the minimum distance from the first end 42 to the second end 52 in the first direction OA.

In an exemplary embodiment, the average distance from the first body 41 to the second body 51 refers to an average value of the maximum distance from the first body 41 to the second body 51 and the minimum distance from the first body 41 to the second body 51. Exemplarily, the maximum distance, the minimum distance and the average distance from the first body 41 to the second body 51 are all equal to d1.

Figure 3:
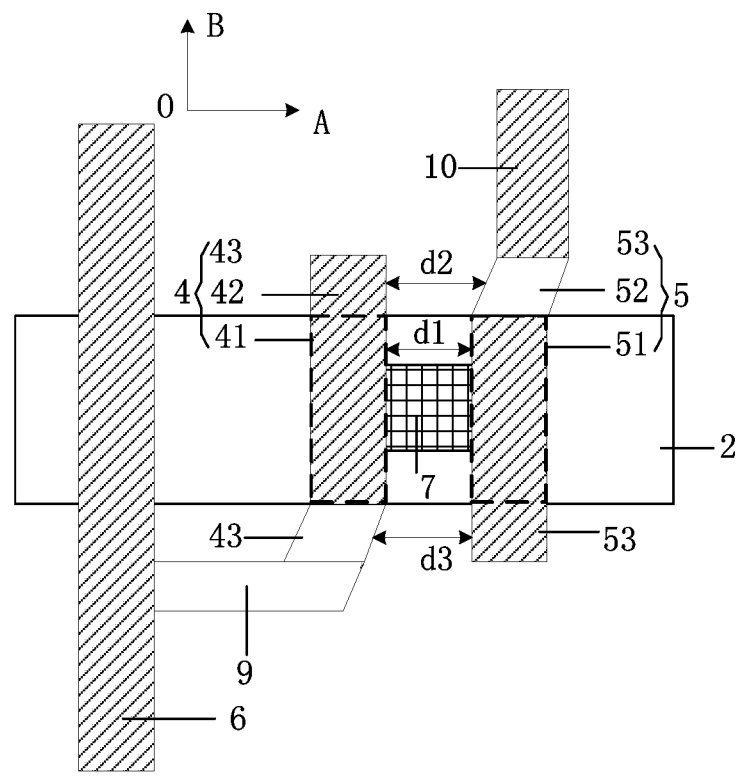
FIG. 3 is a schematic structural diagram illustrating an array substrate provided in embodiments of the present application.

Exemplarily, with reference to FIG. 3, in the first direction OA, the minimum distance from the first end 42 to the second end 52 is equal to the average distance d1 from the first body 41 to the second body 51. In the first direction OA, a distance from an area of the first end 42 not overlapping with the gate to an area of the second end 52 not overlapping with the gate is greater than the average distance d1 from the first body 41 to the second body 51.

Except for the minimum distance from the first end 42 to the second end 52, in the first direction OA, the distance from the first end 42 to the second end 52 is represented by d2, where d2>d1.

Herein, the type of the thin film transistor is not limited. Exemplarily, the thin film transistor may be an N-type transistor or a P-type transistor.

In an exemplary embodiment, with reference to FIG. 3, a part of a gate line 2 in the array substrate may be used as the gate of the thin film transistor; or the gate line and the gate of the thin film transistor may be independently disposed and are connected. The accompanying drawings provided in embodiments of the present application are drawn with a part of the gate line 2 being used as the gate of the thin film transistor.

Exemplarily, the gate line and the gate of the thin film transistor are made of the same material, for example, the material may include any one of copper, aluminum, nickel, molybdenum and titanium, or a combination of at least two metals disposed to be stacked.

Exemplarily, in FIG. 3, the first direction OA is a horizontal direction. In fact, the first direction OA may also be other directions and may be specifically determined according to the design of the array substrate. In embodiments of the present application, description is made by taking the first direction OA as the horizontal direction.

In an exemplary embodiment, the first electrode 4 of the thin film transistor may be a source, and the second electrode 5 of the thin film transistor may be a drain. Alternatively, the first electrode 4 of the thin film transistor may be the drain, and the second electrode 5 of the thin film transistor may be the source. In embodiments of the present application, description is made by taking the first electrode 4 of the thin film transistor as the source, and taking the second electrode 5 of the thin film transistor as the drain.

In an exemplary embodiment, the first electrode 4 and second electrode 5 of the thin film transistor are both located in the same conducting layer such as a source-drain metal layer SD. Exemplarily, a material of the source-drain metal layer may include any one of copper, aluminum, nickel, molybdenum and titanium and a combination of at least two metals disposed to be stacked.

Each of the orthographic projection of the first body 41 on the base of the array substrate and the orthographic projection of the second body 51 on the base of the array substrate is located in the orthographic projection of the gate on the base as follows.

Figure 4:
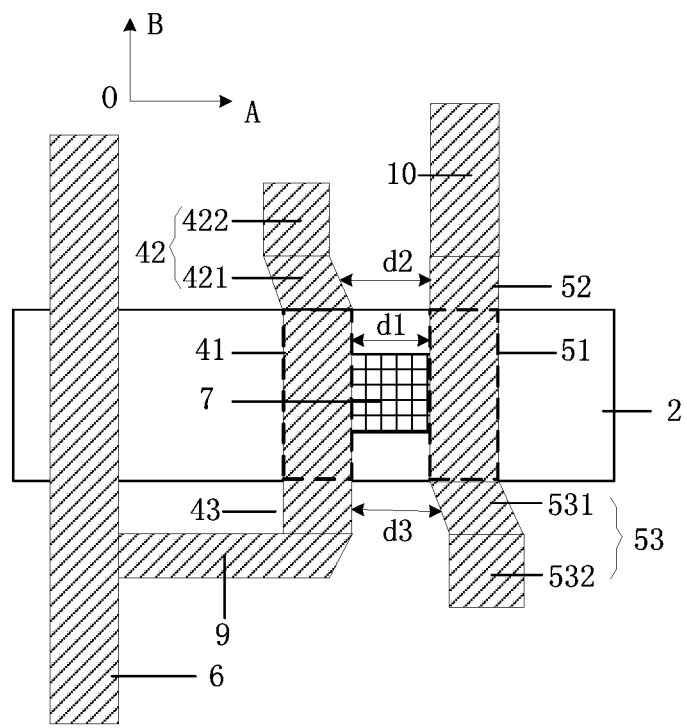
FIG. 4 is a schematic structural diagram illustrating another array substrate provided in embodiments of the present application.
Figure 5:
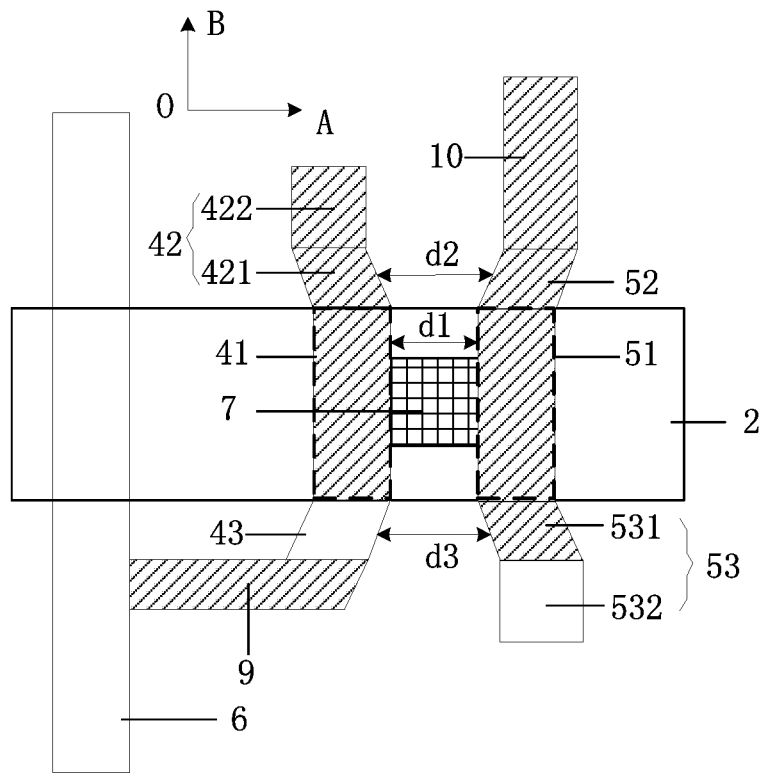
FIG. 5 is a schematic structural diagram illustrating another array substrate provided in embodiments of the present application.

In a first situation, with reference to FIG. 3, FIG. 4 or FIG. 5, each of an outer contour of the orthographic projection of the first body 41 on the base of the array substrate and an outer contour of the orthographic projection of the second body 51 on the base of the array substrate partially overlaps with an outer contour of the orthographic projection of the gate on the base.

Figure 6:
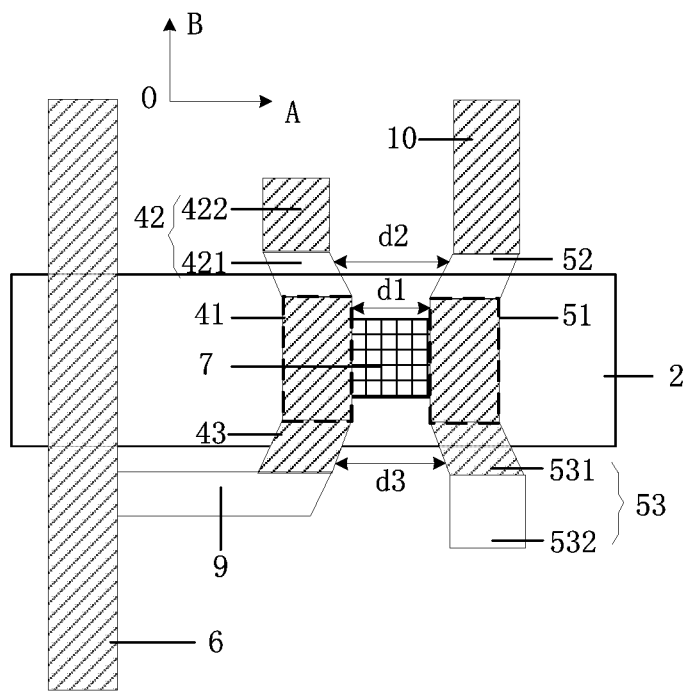
FIG. 6 is a schematic structural diagram illustrating another array substrate provided in embodiments of the present application.

In a second situation, with reference to FIG. 6, each of the outer contour of the orthographic projection of the first body 41 on the base of the array substrate and the outer contour of the orthographic projection of the second body 51 on the base of the array substrate is located in the outer contour of the orthographic projection of the gate on the base.

Each of the orthographic projection of at least partial area of the first end 42 on the base and the orthographic projection of at least partial area of the second end 52 on the base does not overlap with the orthographic projection of the gate on the base as follows.

In a first situation, with reference to FIG. 6, each of the orthographic projection of partial area of the first end 42 on the base and the orthographic projection of partial area of the second end 52 on the base does not overlap with the orthographic projection of the gate on the base.

In a second situation, with reference to FIG. 3, FIG. 4 or FIG. 5, each of the orthographic projection of the first end 42 on the base and the orthographic projection of the second end 52 on the base does not overlap with the orthographic projection of the gate on the base.

Herein, the shape of the orthographic projection of the first end 42 on the base and the shape of the orthographic projection of the second end 52 on the base are not limited and may be specifically determined according to an actual design.

In addition, the shape of the orthographic projection of the first end 42 on the base may be the same as that of the orthographic projection of the second end 52 on the base, or the shape of the orthographic projection of the first end 42 on the base may be different from that of the orthographic projection of the second end 52 on the base.

For example, with reference to FIG. 3, the orthographic projection of the first end 42 on the base is a rectangle, and the orthographic projection of the second end 52 on the base is a parallelogram.

For another example, with reference to FIG. 4, the orthographic projection of the first end 42 on the base is a shape constituted by a rectangle and a parallelogram, and the orthographic projection of the second end 52 on the base is a rectangle.

Figure 2:
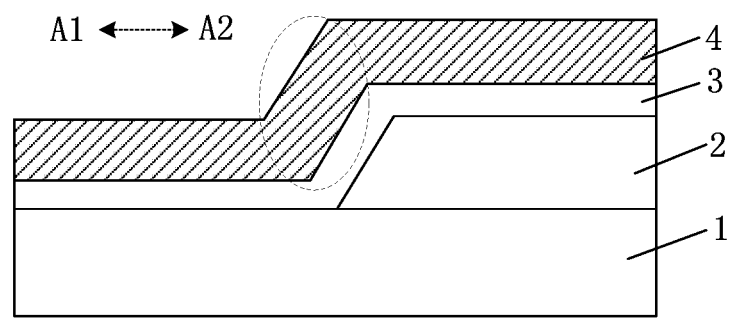
FIG. 2 is a schematic structural diagram illustrating another array substrate in the related art.

In the related art, during the preparation of the array substrate, in the case of preparation process fluctuation or limited alignment accuracy, an overlapping area between the first electrode and the second electrode of the thin film transistor located in the source-drain metal layer and gates located in a gate layer shifts or the area of the overlapping area changes, so that the capacitance of parasitic capacitor generated between two conducting layers changes. Accordingly, different subpixels of the array substrate have different parasitic capacitances, and influences of different parasitic capacitances on the charging rate of the subpixels are inconsistent, resulting in different charging rates of different subpixels. In order to solve this problem, with reference to FIG. 1, in the related art, lengths of the first electrode 4 and the second electrode 5 of the thin film transistor in a direction parallel to a data line 6 are greater than a width of the gate in the direction parallel to the data line 6, so that in different subpixels, the area of the overlapping area between the first electrode 4 and the second electrode 5 of the thin film transistor and the gate located in the gate layer tends to be the same even if the preparation process fluctuates. However, due to the influences of the thickness of the gate located in a bottom layer, partial areas of the first electrode 4 and the second electrode 5 are located on a climbing position shown by a dotted-line circle in FIG. 2. During the preparation of the array substrate, conducting materials (such as residues of metal materials) are easily remained at the climbing position, so that short circuits of the first electrode 4 and the second electrode 5 easily occur at the position indicated by the dotted line circle in FIG. 1, resulting in abnormal use of the array substrate.

In embodiments of the present application, the first electrode 4 includes the first body 41 and the first end 42, the second electrode 5 includes the second body 51 and the second end 52, the first end 42 and the second end 52 are located on the same side of the gate, and a non-overlapping area is between the projections of the first end 42 and the second end 52 and the projection of the gate; and in the first direction OA, the average distance from the first end 42 to the second end 52 is greater than the average distance from the first body 41 to the second body 51. In this way, the average distance from the first end 42 to the second end 52 can be increased as much as possible in the case that the distance from the first body 41 to the second body 51 is unchanged and a aspect ratio of the thin film transistor is ensured to be unchanged. Therefore, the probability that the short circuits of the first electrode 4 and the second electrode 5 occur at the climbing position is reduced to the great extent, and the preparation yield and quality of the array substrate are improved.

In some embodiments of the present application, with reference to FIG. 3 to FIG. 8, the first electrode 4 further includes a third end 43, and the first end 42 and the third end 43 are connected via the first body 41; the second electrode 5 further includes a fourth end 53, and the second end 52 and the fourth end 53 are connected via the second body 51.

Each of the orthographic projections of at least partial area of the third end 43 and at least partial area of the fourth end 53 on the base does not overlap with the orthographic projection of the gate on the base.

In the first direction OA, an average distance from the third end 43 to the fourth end 53 is greater than the average distance from the first body 41 to the second body 51

In an exemplary embodiment, the average distance from the third end 43 to the fourth end 53 refers to an average value of the maximum distance from the third end 43 to the fourth end 53 and the minimum distance from the third end 43 to the fourth end 53 in the first direction OA.

In an exemplary embodiment, the average distance from the first body 41 to the second body 51 refers to an average value of the maximum distance from the first body 41 to the second body 51 and the minimum distance from the first body 41 to the second body 51. Exemplarily, the maximum distance, the minimum distance and the average distance from the first body 41 to the second body 51 are all equal to d1.

Exemplarily, with reference to FIG. 3, in the first direction OA, the minimum distance from the third end 43 to the fourth end 53 is equal to the average distance d1 from the first body 41 to the second body 51. In the first direction OA, a distance from an area of the third end 43 not overlapping with the gate to an area of the fourth end 53 not overlapping with the gate is greater than the average distance d1 from the first body 41 to the second body 51.

Except for the minimum distance from the third end 43 to the fourth end 53, in the first direction OA, a distance from the third end 43 to the fourth end 53 is represented by d3, and d3>d1.

A relationship between the average distance from the third end 43 to the fourth end 53 and the average distance from the first end 42 to the second end 52 is not limited herein, and may be specifically determined according to the design of an actual product.

The shape of the orthographic projection of the third end 43 on the base and the shape of the orthographic projection of the fourth end 53 on the base are not limited herein, and may be specifically determined according to an actual design.

In addition, the shape of the orthographic projection of the third end 43 on the base may be the same as that of the orthographic projection of the fourth end 53 on the base, or the shape of the orthographic projection of the third end 43 on the base may be different from that of the orthographic projection of the fourth end 53 on the base.

Each of the orthographic projection of at least partial area of the third end 43 on the base and the orthographic projection of at least partial area of the fourth end 53 on the base does not overlap with the orthographic projection of the gate on the base as follows.

In a first situation, with reference to FIG. 6, each of the orthographic projection of a partial area of the third end 43 on the base and the orthographic projection of a partial area of the fourth end 53 on the base does not overlap with the orthographic projection of the gate on the base.

In a second situation, with reference to FIG. 3 to FIG. 5, each of the orthographic projection of the third end 43 on the base and the orthographic projection of the fourth end 53 on the base does not overlap with the orthographic projection of the gate on the base.

In embodiments of the present application, the third end 43 is further included, the first end 42 and the third end 43 are connected via the first body 41; the second electrode 5 further includes the fourth end 53, and the second end 52 and the fourth end 53 are connected via the second body 51; each of the orthographic projection of at least partial area of the third end 43 on the base and the orthographic projection of at least partial area of the fourth end 53 on the base does not overlap with the orthographic projection of the gate on the base; and in the first direction OA, the average distance from the third end 43 to the fourth end 53 is greater than the average distance from the first body 41 to the second body 51. In this way, the average distance from the third end 43 to the fourth end 53 can be increased as much as possible without changing the distance from the first body 41 to the second body 51. Therefore, the probability of the short circuits of the first electrode 4 and the second electrode 5 at the climbing position is further reduced, and the preparation yield and quality of the array substrate are improved.

Figure 13:
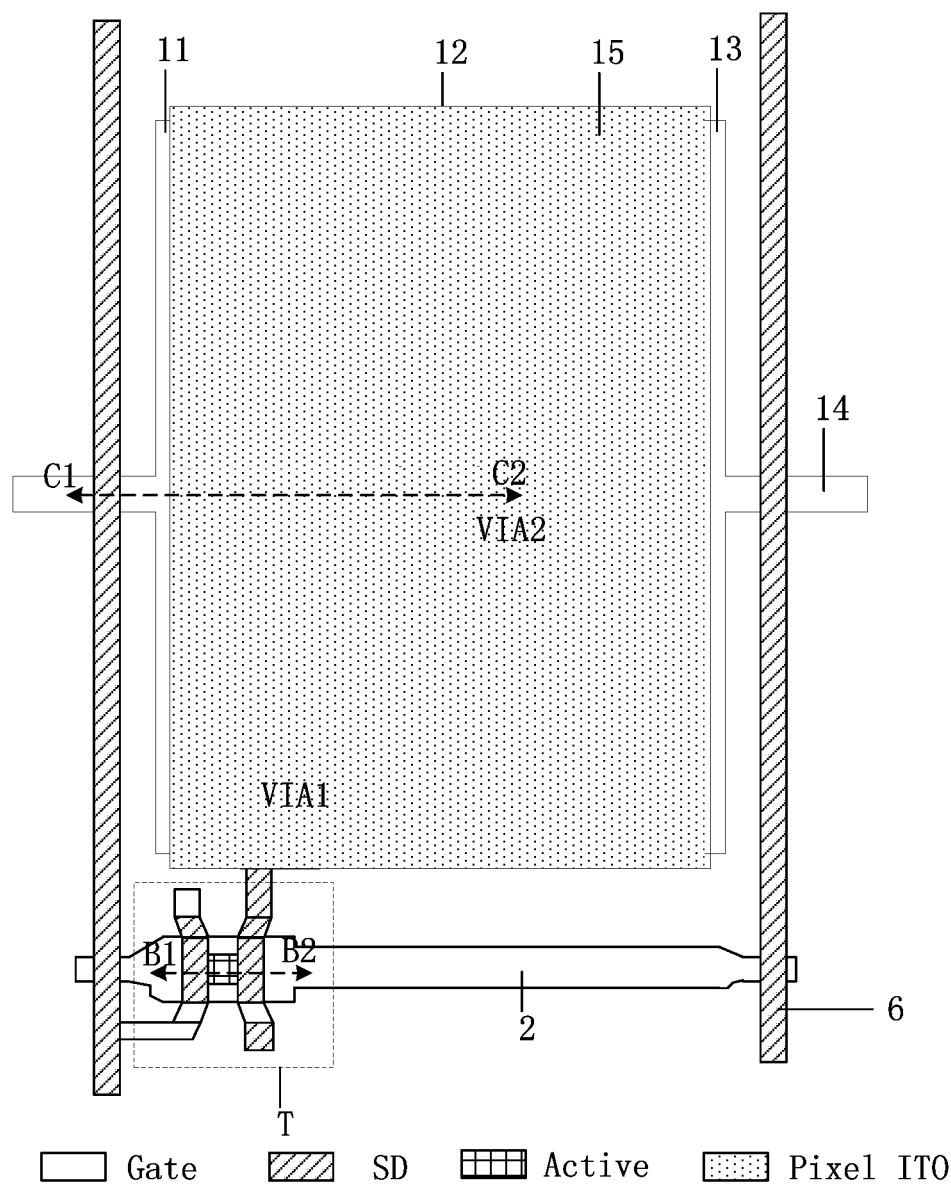
FIG. 13 is a schematic structural diagram illustrating another array substrate provided in embodiments of the present application.

In some embodiments of the present application, as shown in FIG. 3 and FIG. 13, the array substrate further includes a gate line 2, a data line 6, a pixel electrode 15, a first trace 9 and a second trace 10. The data line 6 intersects with the gate line 2, and is insulated from the gate line 2. The gate is electrically connected to the gate line 2. The pixel electrode 15 is located at a position defined by two adjacent data lines 6 and two adjacent gate lines 2. The third end 43 of the first electrode 4 is electrically connected to the data line 2 via the first trace 9, and the second end 52 of the second electrode 5 is electrically connected to the pixel electrode 15 via the second trace 10. The second trace 10 is electrically connected to the pixel electrode 15 by a via hole VIA1.

In FIG. 3, in a direction pointing from a junction between the first body 41 and the third end 43 to a junction between the first trace 9 and the third end 43, the minimum distance from the third end 43 to the data line 6 is gradually reduced.

In a direction pointing from a junction between the second body 51 and the second end 52 to a junction between the second trace 10 and the second end 52, the minimum distance from the second end 52 to the data line 6 is gradually increased.

In embodiments of the present application, with reference to FIG. 3, it may be arranged so that the third end 43 of the first electrode 4 is inclined to be away from the fourth end 53 of the second electrode 5, and the second end 52 of the second electrode 5 is inclined to be away from the first end 42 of the first electrode 4, and then, it is arranged so that the third end 43 is electrically connected to the data line via the first trace 9 and the second end 52 is electrically connected to the second trace 10. In this way, in the first direction OA, the average distance from the third end 43 to the fourth end 53 is greater than the average distance from the first body 41 to the second body 51, and the average distance from the first end 42 to the second end 52 is greater than the average distance from the first body 41 to the second body 51. Therefore, the average distance from the first end 42 to the second end 52 and the average distance from the third end 43 to the fourth end 53 can be increased as much as possible without changing the distance from the first body 41 to the second body 51. Therefore, the probability of short circuits of the first electrode 4 and the second electrode 5 at the climbing position is greatly reduced, and the preparation yield and quality of the array substrate are improved.

In some embodiments of the present application, with reference to FIG. 5, in a direction pointing from a junction between the first body 41 and the first end 42 to a part of the first end 42 away from the first body 41, the minimum distance from the first end 42 to the second end 52 is gradually increased, and the minimum distance from the first end 42 to the data line 6 is gradually reduced.

In a direction pointing from a junction between the second body 51 and the fourth end 53 to a part of the fourth end 53 away from the second body 51, the minimum distance from the fourth end 53 to the third end 43 is gradually increased, and the minimum distance from the fourth end 53 to the data line 6 is gradually increased.

In embodiments of the present application, it may be configured so that the first end 42 of the first electrode 4 is inclined to be away from the second end 52 of the second electrode 5, and the fourth end 53 of the second electrode 5 is inclined to be away from the third end 43 of the first electrode 4, thereby further increasing the average distance from the third end 43 to the fourth end 53 and the average distance from the first end 42 to the second end 52. Therefore, the probability of short circuits of the first electrode 4 and the second electrode 5 at the climbing position is further reduced, and the preparation yield and quality of the array substrate are improved.

In some embodiments of the present application, with reference to FIG. 5, each of orthographic projections of the first end 42, the second end 52, the third end 43 and the fourth end 53 on the base does not overlap with the orthographic projection of the gate on the base.

In some embodiments of the present application, with reference to FIG. 6, each of the orthographic projections of the first end, the second end, the third end and the fourth end on the base partially overlaps with the orthographic projection of the gate on the base.

In some embodiments of the present application, with reference to FIG. 5 to FIG. 8, the first end 42 includes a first adjustment subpart 421 and a first protection subpart 422, and the first adjustment subpart 421 is located between the first body 41 and the first protection subpart 422. In a direction pointing from the first body 41 to the first end 42, the minimum distance from the first adjustment subpart 421 to the data line 6 is gradually reduced, and the minimum distance from the first protection subpart 422 to the data line 6 is kept unchanged.

In embodiments of the present application, the first adjustment subpart 421 is capable of adjusting a distance from the first end 42 of the first electrode 4 to the second end 52 of the second electrode 5, thereby reducing the probability of short circuits of the first electrode 4 and the second electrode 5 and improving the preparation yield of the array substrate. In addition, by providing the first protection subpart 422, on one hand, a sharp conductive pattern similar to the first adjustment subpart 421 a projection of which is a parallelogram in FIG. 5 can be prevented from appearing in the array substrate, and on the other hand, a distance from a sharp end of the first end 42 to the gate can be increased to avoid electrostatic discharge between the first end 42 and the gate. Therefore, the preparation yield of the array substrate is further improved, and the quality of the array substrate is improved. Further, by setting the minimum distance from the first adjustment subpart 421 to the data line 6 to be gradually reduced and keeping the minimum distance from the first protection subpart 422 to each of the data lines 6 unchanged, other abnormalities caused because the distance from the first end 42 of the first electrode to the data line 6 is too short is avoided while the probability of short circuits of the first electrode 4 and the second electrode 5 is reduced, and the design space is also saved.

In some embodiments of the present application, with reference to FIG. 5 to FIG. 8, the fourth end 53 includes a fourth adjustment subpart 531 and a second protection subpart 532, and the fourth adjustment subpart 531 is located between the second body 51 and the second protection subpart 532. In a direction pointing from the second body 51 to the fourth end 53, the minimum distance from the fourth adjustment subpart 531 to the data line 6 is gradually increased, and the minimum distance from the second protection subpart 532 to the data line 6 is kept unchanged.

In the embodiment of the present application, the fourth adjustment subpart 531 can adjust a distance from the fourth end 53 to the third end 43 to reduce the probability of short circuit therebetween. After the second protection subpart 532 is connected to the fourth adjustment subpart 531, a sharp conductive pattern can be avoided in the array substrate, thereby reducing the probability of the occurrence of electrostatic discharge between the fourth end 53 and the gate. In addition, by setting the minimum distance from the fourth adjustment subpart 531 to the data line 6 to be gradually increased and keeping the minimum distance from the second protection subpart 532 to the data line 6 unchanged, the design space is saved while the probability of short circuits of the first electrode 4 and the second electrode 5 is reduced.

In an exemplary embodiment, in a structure as shown in FIG. 5, sizes of the first adjustment subpart, the second adjustment subpart, the third adjustment subpart and the fourth adjustment subpart in a direction parallel to the data line 6 are all set to be greater than or equal to 2 μm.

In some embodiments of the present application, with reference to FIG. 6, the first end 42 includes a first adjustment subpart 421 and a first protection subpart 422, and the first adjustment subpart 421 is located between the first body 41 and the first protection subpart 422.

The second end 52 includes a second adjustment subpart. The third end 43 includes a third adjustment subpart. The fourth end 53 includes a fourth adjustment subpart 531 and a second protection subpart 532, and the fourth adjustment subpart 531 is located between the second body 51 and the second protection subpart 532.

Each of orthographic projections of geometric centers of the first adjustment subpart 421, the second adjustment subpart of the second end 52, the third adjustment subpart of the third end 43 and the fourth adjustment subpart 531 on the base is located on a contour of the orthographic projection of the gate on the base.

In actual applications, since the gate has a certain thickness, the first adjustment subpart, the second adjustment subpart, the third adjustment subpart and the fourth adjustment subpart are all located on the climbing position on a side surface of the gate, and cracks are easily generated on the conductive pattern on the climbing positions due to local stress concentration. In embodiments of the present application, by arranging each of the orthographic projections of the geometric centers of the first adjustment subpart 421, the second adjustment subpart of the second end 52, the third adjustment subpart of the third end 43 and the fourth adjustment subpart 531 on the base to be fallen on the contour of the orthographic projection of the gate on the base, the stress is dispersed on the first adjustment subpart, the second adjustment subpart, the third adjustment subpart and the fourth adjustment subpart more uniformly. Therefore, the probability of the occurrence of cracks or fractures is reduced, and the preparation yield and quality of the array substrate are improved.

In addition, in FIG. 6, in the case of preparation process fluctuation, when the positions of the first electrode (the second electrode) and the gate shift, the first adjustment subpart of the first electrode (the fourth adjustment subpart of the second electrode) may still be located at the climbing position of the gate, so that the distance from the first end to the second end at the climbing position is longer, the distance from the third end to the fourth end is longer. Therefore, short circuit between the first electrode and the second electrode is avoided, and the difficulty of the preparation process is lowered.

In an exemplary embodiment, in FIG. 6, in order to disperse the stress on the first adjustment subpart, the second adjustment subpart, the third adjustment subpart and the fourth adjustment subpart more uniformly, the sizes of the first adjustment subpart, the second adjustment subpart, the third adjustment subpart and the fourth adjustment subpart in a direction OB parallel to the data line 6 are all set to be greater than or equal to 4 μm.

In an exemplary embodiment, the sizes of the first protection subpart 422 and the second protection subpart 532 in the direction OB parallel to the data line 6 are both greater than or equal to 2 μm.

Figure 9:
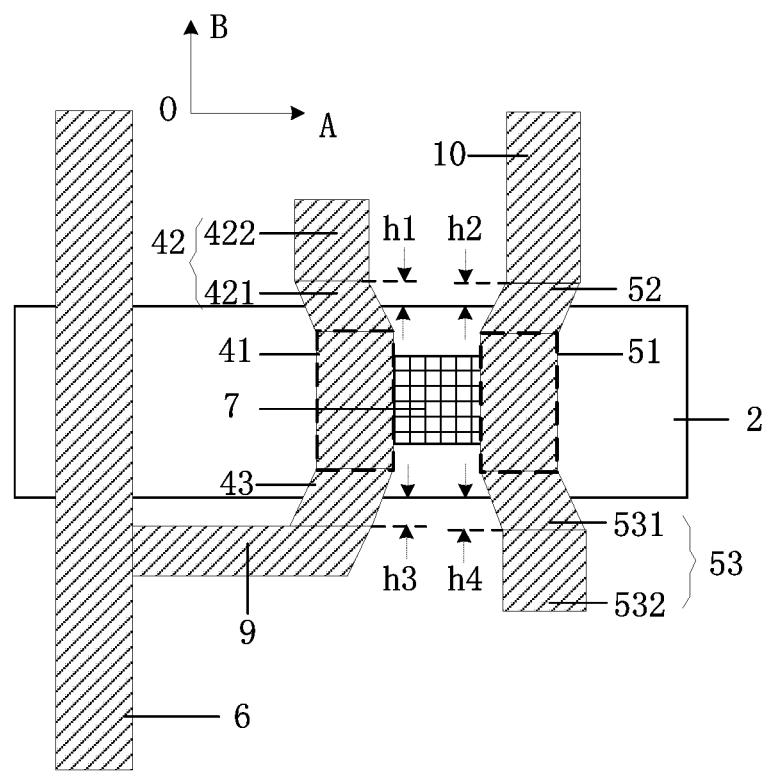
FIG. 9 is a schematic structural diagram illustrating another array substrate provided in embodiments of the present application.
Figure 10:
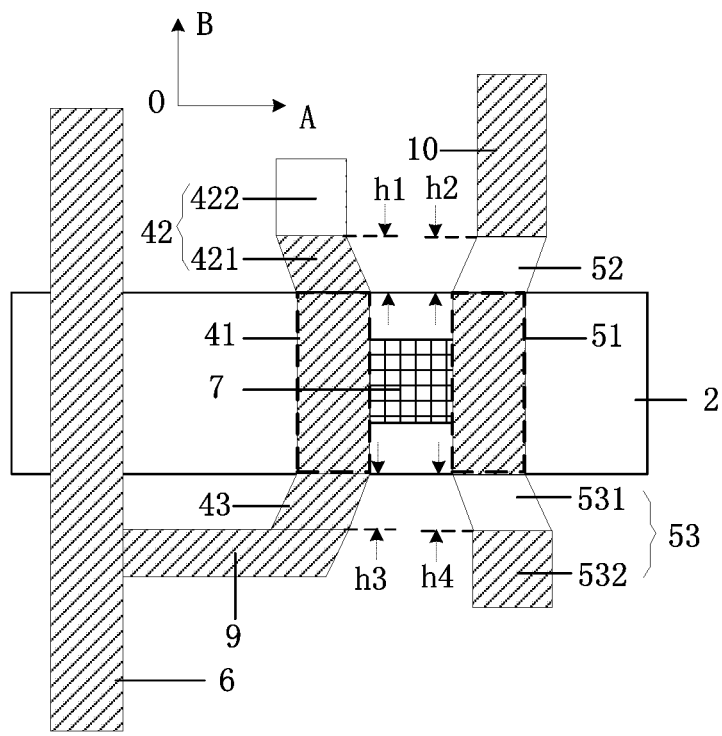
FIG. 10 is a schematic structural diagram illustrating another array substrate provided in embodiments of the present application.

In some embodiments of the present application, with reference to FIG. 9 or FIG. 10, a minimum distance h1 between the orthographic projection of the first protection subpart 422 on the base and the orthographic projection of the gate (such as a partial area of the gate line 2) on the base, a minimum distance h4 between the orthographic projection of the second protection subpart 532 on the base to the orthographic projection of the gate on the base, a minimum distance h3 between the orthographic projection of the first trace 9 on the base to the orthographic projection of the gate on the base, and a minimum distance h2 between the orthographic projection of the second trace 10 on the base to the orthographic projection of the gate on the base are all greater than or equal to 2 μm.

In this case, the sizes of parts, not overlapping with the gate, of the first adjustment subpart, the second adjustment subpart, the third adjustment subpart and the fourth adjustment subpart in the direction OB parallel to the data line 6 are all greater than or equal to 2 μm.

In some embodiments of the present application, each of the shapes of the orthographic projections of the first end 42, the second end 52, the third end 43 and the fourth end 53 on the base includes at least one of an arc, a polygon and a shape constituted by the arc and the polygon.

Exemplarily, with reference to FIG. 3, the orthographic projection of the first end 42 on the base and the orthographic projection of the fourth end 53 on the base are both rectangles, and the orthographic projection of the second end 52 on the base and the orthographic projection of the third end 43 on the base are both parallelograms.

Exemplarily, with reference to FIG. 4, the orthographic projection of the second end 52 on the base and the orthographic projection of the third end 43 on the base are both rectangles, and the orthographic projection of the first end 42 on the base and the orthographic projection of the fourth end 53 on the base are both of a shape constituted by a rectangle and a parallelogram.

Exemplarily, with reference to FIG. 5 and FIG. 6, the orthographic projection of the second end 52 on the base and the orthographic projection of the third end 43 on the base are both parallelograms, and the orthographic projection of the first end 42 on the base and the orthographic projection of the fourth end 53 on the base are both of the shape constituted by a rectangle and a parallelogram.

Figure 7:
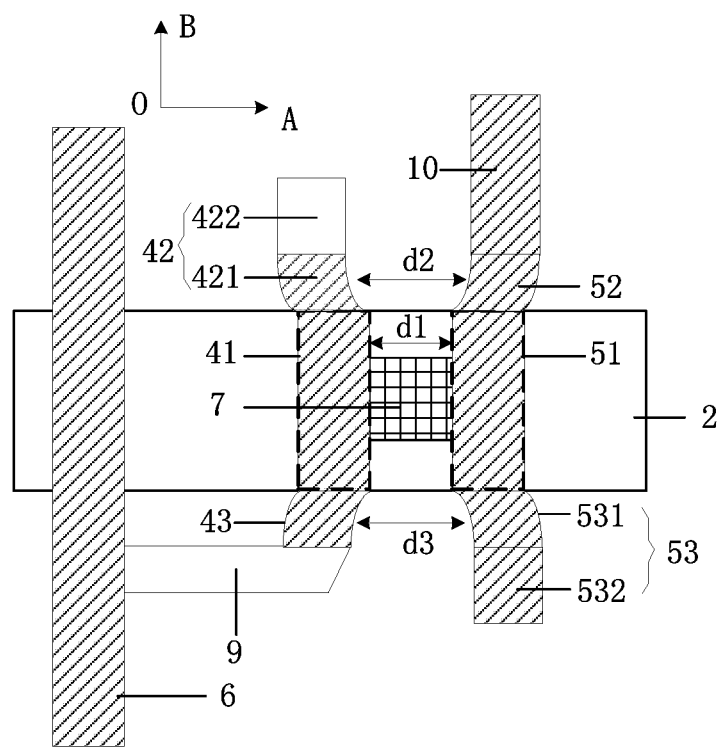
FIG. 7 is a schematic structural diagram illustrating another array substrate provided in embodiments of the present application.
Figure 8:
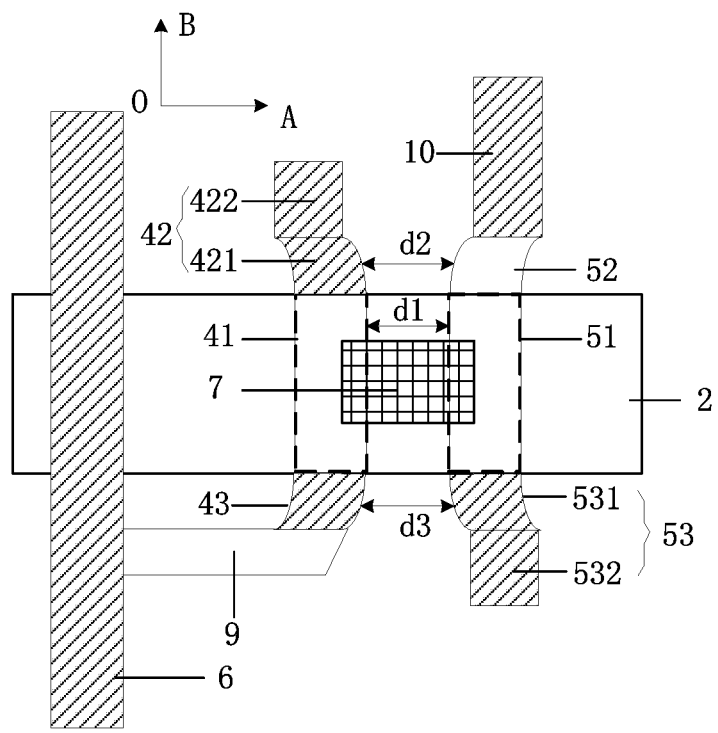
FIG. 8 is a schematic structural diagram illustrating another array substrate provided in embodiments of the present application.

Exemplarily, with reference to FIG. 7 and FIG. 8, the orthographic projection of the second end 52 on the base and the orthographic projection of the third end 43 on the base are both arcs, and the orthographic projection of the first end 42 on the base and the orthographic projection of the fourth end 53 on the base are both of a shape constituted by a rectangle and an arc.

In some embodiments of the present application, with reference to FIG. 9 and FIG. 10, the orthographic projections of the first adjustment subpart 421, the second adjustment subpart, the third adjustment subpart and the fourth adjustment subpart 531 on the base are all parallelograms, and the orthographic projections of the first protection subpart 422 and the second protection subpart 532 on the base are both rectangles.

In some embodiments of the present application, the size of the orthographic projection of the first adjustment subpart 421 on the base in the first direction OA is equal to the size of the orthographic projection of the first protection subpart 422 on the base in the first direction OA, and the size of the orthographic projection of the fourth adjustment subpart 531 on the base in the first direction OA is equal to the size of the orthographic projection of the second protection subpart 532 on the base in the first direction OA.

In embodiments of the present application, the width of the first adjustment subpart 421 is set to be equal to that of the first protection subpart 422, and the width of the fourth adjustment subpart 531 is set to be equal to that of the second protection subpart 532, so that the first adjustment subpart 421 and the fourth adjustment subpart 531 are prevented from exposing a sharp conductive pattern. Accordingly, the probability of the occurrence of electrostatic discharge (ESD) between the first end 42 and the gate as well as between the fourth end 53 and the gate is further reduced, and the preparation yield and quality of the array substrate are further improved.

Figure 11:
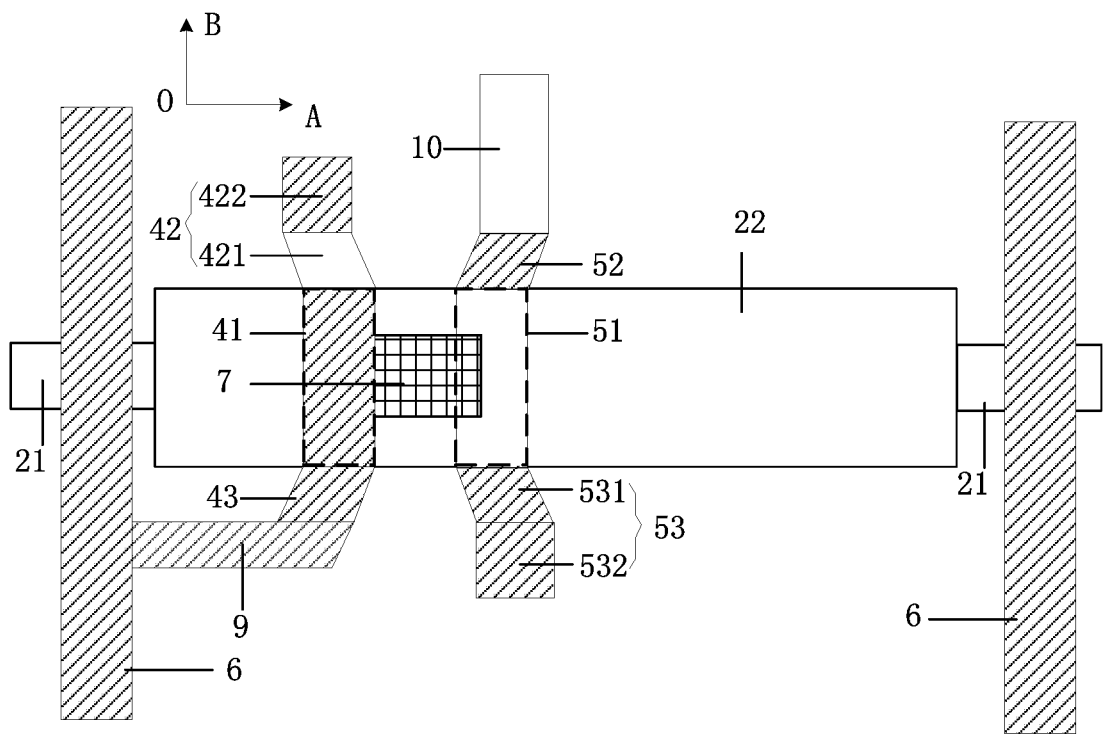
FIG. 11 is a schematic structural diagram illustrating another array substrate provided in embodiments of the present application.

In some embodiments of the present application, with reference to FIG. 11, the gate line 2 includes a first line segment 21 and a second line segment 22. The first line segment 21 intersects with and is insulated from the data line 6. A partial area of the second line segment 22 is used as the gate. A gate insulation layer is disposed between the gate line 2 and the data line 6. The size of the orthographic projection of the second line segment 22 on the base in a direction perpendicular to the first direction OA is greater than the size of the orthographic projection of the first line segment 21 on the base in the direction perpendicular to the first direction OA.

In embodiments of the present application, on one hand, the width of the first line segment 21 intersecting with the data line 6 is reduced, so that the parasitic capacitance generated between the data line 6 and the first line segment 21 can be reduced, thereby reducing adverse effects of the parasitic capacitance on electric signals in the array substrate as much as possible. On the other hand, by increasing the width of the second line segment 22, it can be ensured as much as possible that areas of regions where the gates of different transistors overlap with the first electrodes 4 are consistent and areas of regions where the gates overlap with the second electrodes 5 are consistent even if the process fluctuation or alignment inaccuracy occurs during the preparation of the first electrodes 4 and the second electrodes 5 of the thin film transistor. Therefore, performance differences of the thin film transistors prepared in the case of process fluctuation or alignment inaccuracy are reduced, and the quality of the array substrate is improved.

Figure 12:
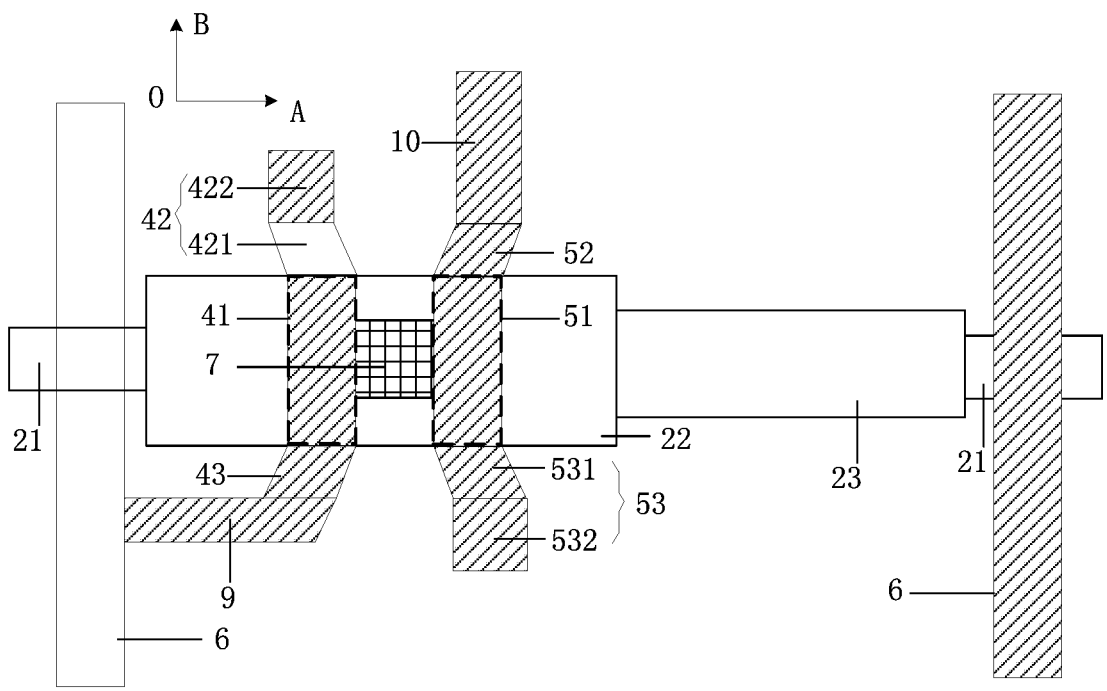
FIG. 12 is a schematic structural diagram illustrating another array substrate provided in embodiments of the present application.

In some embodiments of the present application, with reference to FIG. 12, the gate line 2 includes a first line segment 21, a second line segment 22 and a third line segment 23. The first line segment 21 intersects with and is insulated from the data line 6. the second line segment 22 is used as the gate, and the third line segment 23 is located on an end of the second line segment 22 away from the first line segment 21. The size of the orthographic projection of the second line segment 22 on the base in the direction perpendicular to the first direction OA is greater than the size of the orthographic projection of the third line segment 23 on the base in the direction perpendicular to the first direction OA, and the size of the orthographic projection of the third line segment 23 on the base in the direction perpendicular to the first direction OA is greater than the size of the orthographic projection of the first line segment 21 on the base in the direction perpendicular to the first direction OA.

In the embodiment of the present application, by providing a gate line including three line segments with different widths, on one hand, the parasitic capacitance generated between the data line 6 and the gate line 2 can be reduced, and adverse effects of the parasitic capacitance on a charging rate of the array substrate is avoided. On the other hand, the size of the second line segment 22 used as the gate is set to be maximum, so that the area of a region where the first electrode (the second electrode) overlaps with the gate is stable when preparation process fluctuation occurs or positions of the first electrode (the second electrode) and the gate shift, thereby keeping stable electric property of the thin film transistor. On yet another hand, the width of the third line segment is set to be less than that of the second line segment and be greater than that of the first line segment, the design space is saved while ensuring that the electric signal is stably transmitted, the aperture ratio of the array substrate is increased, and the light transmittance of a display panel prepared by using the array substrate is increased.

Figure 14:
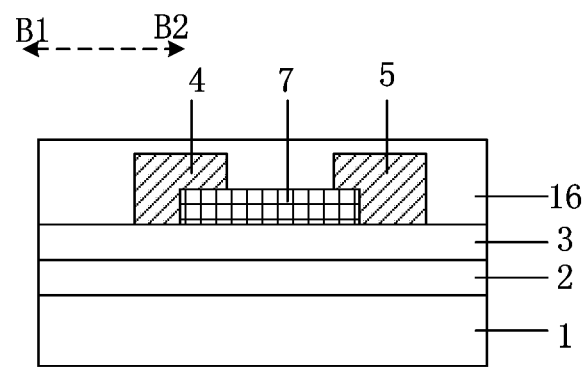
FIG. 14 is a cross-sectional view of FIG. 13 in a direction B1B2.

In some embodiments of the present application, as shown in FIG. 12 and FIG. 14, the array substrate further includes an active layer 7 located on a side of the gate facing away from the base 1. An outer contour of the orthographic projection of the active layer 7 on the base 1 is located in the outer contour of the orthographic projection of the gate on the base 1. Each of a partial area of the first electrode 4 and a partial area of the second electrode 5 is in direct contact with the active layer 7. The size of the orthographic projection of the active layer 7 on the base 1 in the direction perpendicular to the first direction OA is less than the size of the orthographic projection of the first body 41 on the base 1 in the direction perpendicular to the first direction OA, and the size of the orthographic projection of the active layer 7 on the base 1 in the direction perpendicular to the first direction OA is less than the size of the orthographic projection of the second body 51 on the base 1 in the direction perpendicular to the first direction OA.

In an exemplary embodiment, a material of the active layer 7 may include crystal silicon or a metal oxide. For example, the crystal silicon may include monocrystalline silicon, polycrystalline silicon and amorphous silicon, and the metal oxide may include an indium gallium zinc oxide (IGZO).

FIG. 14 is a cross-sectional view of a thin film transistor T in FIG. 13 in a direction B1B2.

In the embodiment of the present application, the width of the active layer 7 is set to be less than the length of the first body 41 and the length of the second body 51, since the distance from the first body 41 to the second body 51 is fixed, in the case of preparation process fluctuation, influences of process fluctuation on the aspect ratio of a channel of a thin film transistor can be avoided as much as possible, and adverse effects of the change of the aspect ratio on the electric property of the thin film transistor can be avoided, so that electric property inconsistence of thin film transistors in different subpixels is avoided.

Taking FIG. 6 as an example, the size of the orthographic projection of the active layer 7 on the base 1 in the direction perpendicular to the first direction OA is the width of the channel of the thin film transistor, and the size from the first body 41 to the second body 51 in the first direction OA is the width of the channel of the thin film transistor.

It should be noted that, in embodiments of the present application, in the first direction OA, the minimum distance from the first body 41 to the second body 51 is equal to the maximum distance from the first body 41 to the second body 51.

In an exemplary embodiment, the size of the orthographic projection of the active layer 7 on the base 1 in the direction perpendicular to the first direction OA is greater than or equal to 5 μm.

In an exemplary embodiment, the size of the orthographic projection of the first body 41 on the base 1 in the direction perpendicular to the first direction OA is equal to the size of the orthographic projection of the second body 51 on the base 1 in the direction perpendicular to the first direction OA.

Exemplarily, the size of the orthographic projection of the first body 41 on the base 1 in the direction perpendicular to the first direction OA is greater than or equal to 8 μm.

In some embodiments, the size of the orthographic projection of the gate on the base 1 in the direction perpendicular to the first direction OA is equal to the size of the orthographic projection of the first body 41 on the base 1 in the direction perpendicular to the first direction OA.

In some embodiments, the size of the orthographic projection of the gate on the base 1 in the direction perpendicular to the first direction OA is greater than the size of the orthographic projection of the first body 41 on the base 1 in the direction perpendicular to the first direction OA.

Exemplarily, a difference of the size of the orthographic projection of the gate on the base 1 in the direction perpendicular to the first direction OA and the size of the orthographic projection of the first body 41 on the base 1 in the direction perpendicular to the first direction OA is greater than or equal to 4 μm.

Exemplarily, a difference of the size of the orthographic projection of the gate on the base 1 in the direction perpendicular to the first direction OA and the size of the orthographic projection of the active layer 7 on the base 1 in the direction perpendicular to the first direction OA is greater than or equal to 5 μm.

In some embodiments of the present application, with reference to FIG. 13, the array substrate includes a first storage capacitance line 11, a second storage capacitance line 12, a third storage capacitance line 13 and a fourth storage capacitance line 14 disposed on the same layer of the gate. The first storage capacitance line 11, the second storage capacitance line 12 and the third storage capacitance line 13 are all located between two adjacent data lines 6, and extend in a direction same as the extension direction of the data line 6. The fourth storage capacitance line 14 intersects with and is connected to each of the first storage capacitance line 11, the second storage capacitance line 12 and the third storage capacitance line 13. Each of orthographic projections of the first storage capacitance line 11, the second storage capacitance line 12, the third storage capacitance line 13 and the fourth storage capacitance line 14 on the base overlaps with the orthographic projection of the pixel electrode 15 on the base.

In embodiments of the present application, a storage capacitor is formed between each of the storage capacitance lines and the pixel electrode to store electric quantity acquired by the subpixels in a charging process.

Figure 15:
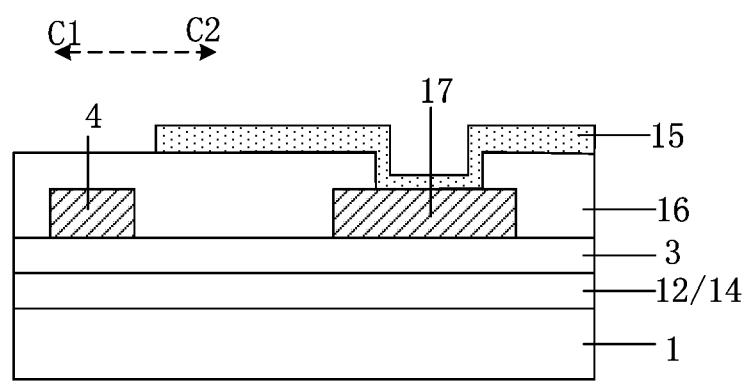
FIG. 15 is a cross-sectional view of FIG. 13 in a direction C1C2.

In some embodiments of the present application, as shown in FIG. 13 and FIG. 15, the second storage capacitance line 12 is located between the first storage capacitance line 11 and the third storage capacitance line 13. The array substrate further includes a conducting island 17 disposed on the same layer with the data line 6. The orthographic projection of an intersection of the second storage capacitance line 12 and the fourth storage capacitance line 14 on the base 1 overlaps with the orthographic projection of the conducting island 17 on the base 1, and the conducting island 17 is electrically connected to the pixel electrode 15 by a via hole VIA2. FIG. 15 is a cross-sectional view of FIG. 13 in a direction C1C2.

It should be noted that the gate and the gate line are located in the same conducting layer, for example, in the gate layer; the first electrode of the thin film transistor, the second electrode of the thin film transistor, the data line and the conducting island are located in the same conducting layer, such as the source-drain metal layer SD. In addition, in FIG. 13, a film layer marked as Active represents the active layer, and a film layer marked as Pixel ITO represents the pixel electrode.

A gate insulation layer 3 is disposed between the gate layer (Gate) and the source-drain metal layer (SD), and an interlayer dielectric layer 16 is disposed between the source-drain metal layer (SD) and the pixel electrode (Pixel ITO).

In embodiments of the present application, by disposing the conducting island 17, when abnormal display, such as flickering, of a certain subpixel in the array substrate occurs, a position where the conducting island 17 is located may be broken down in a laser way, so that the pixel electrode 15 is connected to the storage electrode line 12/14, short circuit occurs in a circuit of the subpixel in which abnormal display occurs to cause display incapability, adverse effects of the normal subpixel on the overall display effect of the display panel prepared by using the array substrate are avoided, and the display effect is improved.

An embodiment of the present application provides a display panel including the array substrate mentioned above.

A specific structure of the array substrate included in the display panel in the embodiment of the present application may refer to the foregoing description, but is not repeated herein.

In an exemplary embodiment, the display panel may further include a color film base plate opposite to the array substrate.

The display panel provided in the embodiment of the present application is an LCD (Liquid Crystal Display). In addition, the display panel may be display devices such as an LCD display and any product or component having a display function, such as a TV, a digital camera, a mobile phone and a tablet computer including these display devices.

Exemplarily, the display panel is a liquid crystal display panel in an ADS (Advanced Super Dimension Switch) display mode, where an ADS is a joint name of a core technology represented by a wide viewing angle technology.

In the display panel provided in the embodiment of the present application, the first electrode 4 includes the first body 41 and the first end 42, the second electrode 5 includes the second body 51 and the second end 52, the first end 42 and the second end 52 are located on the same side of the gate, and there are areas where the projection of the first end 42 and the projection of the second end 52 do not overlap with the projection of the gate; and in the first direction OA, the average distance from the first end 42 to the second end 52 is greater than the average distance from the first body 41 to the second body 51. In this way, the average distance from the first end 42 to the second end 52 can be increased as much as possible in the case that the distance from the first body 41 to the second body 51 is unchanged and the aspect ratio of the thin film transistor ensured to be unchanged. Therefore, the probability of the occurrence of short circuits of the first electrode 4 and the second electrode 5 at the climbing position is greatly reduced, the preparation yield and quality of the array substrate are improved, and a display effect of the display panel is improved.

The above descriptions are only specific implementations of the present application, but the protection scope of the present application is not limited thereto. Any variations or replacements that can be readily envisioned by those skilled in the art within the technical scope disclosed by the present application should fall within the protection scope of the present application. Therefore, the protection scope of the present application should be subject to the protection scope defined in the claims.

The invention claimed is:

1. An array substrate, comprising:
   a gate of a thin film transistor, extending in a first direction;

a first electrode of the thin film transistor, comprising a first body and a first end that are connected to each other; and a second electrode of the thin film transistor, comprising a second body and a second end that are connected to each other;

wherein an orthographic projection of the first body on a base of the array substrate and an orthographic projection of the second body on the base are located in an orthographic projection of the gate on the base, an orthographic projection of at least partial area of the first end on the base and an orthographic projection of at least partial area of the second end on the base do not overlap with the orthographic projection of the gate on the base, and an orthographic projection of the first end on the base and an orthographic projection of the second end on the base are both located on a same side of the orthographic projection of the gate on the base;

wherein in the first direction, an average distance from the first end to the second end is greater than an average distance from the first body to the second body;

wherein the first electrode further comprises a third end, and the first end and the third end are connected via the first body; the second electrode further comprises a fourth end, and the second end and the fourth end are connected via the second body; an orthographic projection of at least partial area of the third end on the base and an orthographic projection of at least partial area of the fourth end on the base do not overlap with the orthographic projection of the gate on the base; in the first direction, an average distance from the third end to the fourth end is greater than the average distance from the first body to the second body;

wherein the array substrate further comprises a gate line, a data line, a pixel electrode, a first trace and a second trace, wherein the data line intersects with the gate line and is insulated from the gate line, the gate is electrically connected to the gate line, the pixel electrode is located at a position defined by two adjacent data lines and two adjacent gate lines, the third end of the first electrode is electrically connected to the data line via the first trace, and the second end of the second electrode is electrically connected to the pixel electrode via the second trace;

wherein in a direction pointing from a junction between the first body and the third end to a junction between the first trace and the third end, a minimum distance from the third end to the data line is gradually reduced; and in a direction pointing from a junction between the second body and the second end to a junction between the second trace and the second end, a minimum distance from the second end to the data line is gradually increased;

wherein the gate line comprises a first line segment and a second line segment, the first line segment intersects with and is insulated from the data line, and a partial area of the second line segment is used as the gate;

wherein a size of an orthographic projection of the second line segment on the base in a direction perpendicular to the first direction is greater than a size of an orthographic projection of the first line segment on the base in the direction perpendicular to the first direction.

2. The array substrate according to claim 1, wherein in a direction pointing from a junction between the first body and the first end to a part of the first end facing away from the first body, a minimum distance from the first end to the second end is gradually increased, and a minimum distance from the first end to the data line is gradually reduced; and in a direction pointing from a junction between the second body and the fourth end to a part of the fourth end facing away from the second body, a minimum distance from the fourth end to the third end is gradually increased, and a minimum distance from the fourth end to the data line is gradually increased.

3. The array substrate according to claim 2, wherein each of the orthographic projections of the first end, the second end, the third end and the fourth end on the base does not overlap with the orthographic projection of the gate on the base.

4. The array substrate according to claim 3, wherein the first end comprises a first adjustment subpart and a first protection subpart, and the first adjustment subpart is located between the first body and the first protection subpart;

wherein in a direction pointing from the first body to the first end, a minimum distance from the first adjustment subpart to the data line is gradually reduced, and a minimum distance from the first protection subpart to the data line is kept unchanged.

5. The array substrate according to claim 3, wherein the fourth end comprises a fourth adjustment subpart and a second protection subpart, and the fourth adjustment subpart is located between the second body and the second protection subpart;

wherein in a direction pointing from the second body to the fourth end, a minimum distance from the fourth adjustment subpart to the data line is gradually increased, and a minimum distance from the second protection subpart to the data line is kept unchanged.

6. The array substrate according to claim 2, wherein each of the orthographic projections of the first end, the second end, the third end and the fourth end on the base partially overlaps with the orthographic projection of the gate on the base.

7. The array substrate according to claim 6, wherein the first end comprises a first adjustment subpart and a first protection subpart, and the first adjustment subpart is located between the first body and the first protection subpart; the second end comprises a second adjustment subpart; the third end comprises a third adjustment subpart; the fourth end comprises a fourth adjustment subpart and a second protection subpart, and the fourth adjustment subpart is located between the second body and the second protection subpart;

wherein each of orthographic projections of geometric centers of the first adjustment subpart, the second adjustment subpart, the third adjustment subpart and the fourth adjustment subpart on the base is located on a contour of the orthographic projection of the gate on the base.

8. The array substrate according to claim 7, wherein a minimum distance from an orthographic projection of the first protection subpart on the base to the orthographic projection of the gate on the base, a minimum distance from an orthographic projection of the second protection subpart on the base to the orthographic projection of the gate on the base, a minimum distance from an orthographic projection of the first trace on the base to the orthographic projection of the gate on the base and a minimum distance from an orthographic projection of the second trace on the base to the orthographic projection of the gate on the base are all greater than or equal to 2 μm.

9. The array substrate according to claim 7, wherein each of shapes of the orthographic projections of the first end, the second end, the third end and the fourth end on the base comprises at least one of an arc, a polygon and a shape constituted by the arc and the polygon.

10. The array substrate according to claim 9, wherein the shapes of the orthographic projections of the first adjustment subpart, the second adjustment subpart, the third adjustment subpart and the fourth adjustment subpart on the base are all parallelograms, and the shapes of the orthographic projections of the first protection subpart and the second protection subpart on the base are both rectangles.

11. The array substrate according to claim 9, wherein a size of the orthographic projection of the first adjustment subpart on the base in the first direction is equal to a size of the orthographic projection of the first protection subpart on the base in the first direction, and a size of the orthographic projection of the fourth adjustment subpart on the base in the first direction is equal to a size of the orthographic projection of the second protection subpart on the base in the first direction.

12. The array substrate according to claim 1, wherein the gate line further comprises a third line segment, and the third line segment is located on an end of the second line segment facing away from the first line segment;
wherein the size of the orthographic projection of the second line segment on the base in a direction perpendicular to the first direction is greater than a size of an orthographic projection of the third line segment on the base in the direction perpendicular to the first direction, and the size of the orthographic projection of the third line segment on the base in the direction perpendicular to the first direction is greater than the size of the orthographic projection of the first line segment on the base in the direction perpendicular to the first direction.

13. The array substrate according to claim 1, wherein the array substrate further comprises an active layer located on a side of the gate facing away from the base, an outer contour of an orthographic projection of the active layer on the base is located within an outer contour of the orthographic projection of the gate on the base, and a partial area of the first electrode and a partial area of the second electrode are in direct contact with the active layer;
wherein a size of the orthographic projection of the active layer on the base in a direction perpendicular to the first direction is less than a size of the orthographic projection of the first body on the base in the direction perpendicular to the first direction, and the size of the orthographic projection of the active layer on the base in the direction perpendicular to the first direction is less than a size of the orthographic projection of the second body on the base in the direction perpendicular to the first direction.

14. The array substrate according to claim 1, wherein the array substrate comprises a first storage capacitance line, a second storage capacitance line, a third storage capacitance line and a fourth storage capacitance line disposed on a same layer of the gate;
wherein the first storage capacitance line, the second storage capacitance line and the third storage capacitance line are all located between two adjacent data lines and extend in a direction same as an extension direction of the data line; and
the fourth storage capacitance line intersects with and is connected to each of the first storage capacitance line, the second storage capacitance line and the third storage capacitance line, and each of orthographic projections of the first storage capacitance line, the second storage capacitance line, the third storage capacitance line and the fourth storage capacitance line on the base overlaps with an orthographic projection of the pixel electrode on the base.

15. The array substrate according to claim 14, wherein the second storage capacitance line is located between the first storage capacitance line and the third storage capacitance line, the array substrate further comprises a conducting island disposed on the same layer with the data line, an orthographic projection of an intersection of the second storage capacitance line and the fourth storage capacitance line on the base overlaps with an orthographic projection of the conducting island on the base, and the conducting island is electrically connected to the pixel electrode.

16. A display panel comprising an array substrate, wherein the array substrate comprises:
a gate of a thin film transistor, extending in a first direction;
a first electrode of the thin film transistor, comprising a first body and a first end that are connected to each other; and
a second electrode of the thin film transistor, comprising a second body and a second end that are connected to each other;
wherein an orthographic projection of the first body on a base of the array substrate and an orthographic projection of the second body on the base are located in an orthographic projection of the gate on the base, an orthographic projection of at least partial area of the first end on the base and an orthographic projection of at least partial area of the second end on the base do not overlap with the orthographic projection of the gate on the base, and an orthographic projection of the first end on the base and an orthographic projection of the second end on the base are both located on a same side of the orthographic projection of the gate on the base;
wherein in the first direction, an average distance from the first end to the second end is greater than an average distance from the first body to the second body;
wherein the first electrode further comprises a third end, and the first end and the third end are connected via the first body; the second electrode further comprises a fourth end, and the second end and the fourth end are connected via the second body;
wherein an orthographic projection of at least partial area of the third end on the base and an orthographic projection of at least partial area of the fourth end on the base do not overlap with the orthographic projection of the gate on the base; in the first direction, an average distance from the third end to the fourth end is greater than the average distance from the first body to the second body;
the array substrate further comprises a gate line, a data line, a pixel electrode, a first trace and a second trace, wherein the data line intersects with the gate line and is insulated from the gate line, the gate is electrically connected to the gate line, the pixel electrode is located at a position defined by two adjacent data lines and two adjacent gate lines, the third end of the first electrode is electrically connected to the data line via the first trace, and the second end of the second electrode is electrically connected to the pixel electrode via the second trace;
wherein in a direction pointing from a junction between the first body and the third end to a junction between the first trace and the third end, a minimum distance from the third end to the data line is gradually reduced; and in a direction pointing from a junction between the second body and the second end to a junction between the second trace and the second end, a minimum distance from the second end to the data line is gradually increased;

wherein the gate line comprises a first line segment and a second line segment, the first line segment intersects with and is insulated from the data line, and a partial area of the second line segment is used as the gate;

wherein a size of an orthographic projection of the second line segment on the base in a direction perpendicular to the first direction is greater than a size of an orthographic projection of the first line segment on the base in the direction perpendicular to the first direction.

* * * * *